United States Patent [19]

Shibayama et al.

[11] 4,316,178
[45] Feb. 16, 1982

[54] DIGITAL-TO-ANALOG CONVERSION SYSTEM WITH COMPENSATION CIRCUIT

[75] Inventors: Akinori Shibayama, Tokyo; Kenji Maio, Hinode; Masao Hotta, Hachioji; Norio Yokozawa, Huchu, all of Japan

[73] Assignees: Nippon Telegraph & Telephone Public Corp.; Hitachi, Ltd., both of Tokyo, Japan

[21] Appl. No.: 113,674

[22] Filed: Jan. 21, 1980

[30] Foreign Application Priority Data

Jan. 29, 1979 [JP] Japan .................................. 54/8231

[51] Int. Cl.³ .......................................... H03K 13/02
[52] U.S. Cl. ...................... 340/347 DA; 340/347 CC
[58] Field of Search ................ 340/347 CC, 347 DA; 318/532, 533, 534; 360/78

[56] References Cited

U.S. PATENT DOCUMENTS

| | | | |
|---|---|---|---|
| 3,881,184 | 4/1975 | Koepcke | 360/78 |
| 4,070,665 | 1/1978 | Glennon | 340/347 CC |
| 4,122,503 | 10/1978 | Allan | 318/634 |

OTHER PUBLICATIONS

Rullgard, "IBM Technical Disclosure Bulletin", vol. 10, No. 1, Jun. 1967, pp. 5–6.
Schulz, "IBM Technical Disclosure Bulletin", vol. 16, No. 1, Jun. 1973, pp. 137–138.

Primary Examiner—Charles D. Miller
Attorney, Agent, or Firm—Craig and Antonelli

[57] ABSTRACT

In a digital-to-analog converter having means to convert a digital input signal into an analog signal, processing means to evaluate an error attendant upon the conversion, and memory means to store the evaluated error; a digital-to-analog converter with a compensating circuit wherein the processing means comprises a ramp voltage generator, a clock pulse generator, and counting means to count clock pulses of the generator and to deliver the error on the basis of the count value of the clock pulses at each time when the ramp voltage exceeds the output of the conversion means.

7 Claims, 10 Drawing Figures

DIGITAL-TO-ANALOG CONVERSION SYSTEM WITH COMPENSATION CIRCUIT

BACKGROUND OF THE INVENTION

1. Field of the Invention

This invention relates to a digital-to-analog conversion system with a compensation circuit (hereinbelow, called "DAC system") in which the linearity error of a digital-to-analog converter (hereinbelow, called "DAC") of inferior linearity characteristics is compensated for by the use of the compensation circuit. More particularly, it relates to a DAC system which has a construction suitable for the form of an IC by employing a ramp voltage generator for the reference of the compensation of the linearity of a DAC output.

2. Description of the Prior Art

Regarding the compensation of the linearity error of a DAC, a circuit arrangement shown in FIG. 1 has been known. Hereunder, a method of compensation in the circuit arrangement of FIG. 1 will be described.

In a conventional DAC, the linearity of a DAC output corresponding to an upper bit of a digital input signal (hereinafter, it shall be simply termed "linearity", and the linearity error of the DAC output based thereon shall be referred to as "linearity error") is inferior, and the linearity of a lower bit of the digital input signal is good as compared with that of the upper bit. It is therefore possible to compensate for the linearity error of the upper bit by utilizing the lower bit.

In FIG. 1, by way of example a case is supposed where a digital input signal 10 is made up of an upper bit part 10a including 4 bits and a lower bit part 10b including 6 bits, totaling 10 bits, and where the linearity of the upper 4 bits is inferior while the linearity of the lower 6 bits is superior. It is also assumed that the linearity error of the upper 4 bits is expressed by at most lower 6 bits ($\pm \frac{1}{2}$LSB$\times 32$) including the sign bit, with a unit of $\frac{1}{2}$ LSB.

The digital input signal 10 is applied through a register 11 to a first DAC 12, in which it is converted into an analog current $I_o$. This current $I_o$ is converted into a voltage $E_o$ by means of an output amplifier 13 which consists of an operational amplifier 13-1 and a feedback resistor 13-2. The voltage $E_o$ is converted into a digital quantity 10' of 10 bits by an analog-to-digital converter (hereinafter, termed "ADC") of high precision.14. In an adder 15, the digital quantity difference 15a between the digital quantity 10' and the digital input signal 10 is calculated. The digital quantity difference 15a is a quantity corresponding to a linearity error for the upper bits of the digital input signal, and can be expressed by 5-6 bits or so with the sign bit included. It is written into that address of a memory 16 which has been appointed by the address signal 10a composed of the upper 4 bits of the digital input signal 10.

The above processings are executed for all the $2^4$ signals (0000, 0001, 0010, . . . 1111) constituting the upper 4 bits of the digital input signal, and linearity errors for the respective signals are successively written into predetermined addresses of the memory 16.

In a digital-to-analog converting operation for any digital input signal 10 made up of 10 bits, the digital input signal 10 is fed through the resister 11 and is converted into the current $I_o$ by the first DAC 12. Using the upper 4 bits of the digital input signal 10 as an address, a corresponding linearity error is read out as a compensation quantity from the memory 16. The read compensation quantity is fed through a register 17 and is converted into a current $I_o'$ by a second DAC 18. This current $I_o'$ is added to the current $I_o$.

The current value $(I_o + I_o')$ obtained by the addition is converted into a voltage value by the output amplifier 13. Thus, the output voltage $E_o$ with the error of the upper 4 bits of the digital input signal compensated for is obtained.

Accordingly, when a compensation circuit portion 19 in FIG. 1 is assembled in the DAC of poor linearity characteristics into the form of a 1-chip IC, an integrated DAC system of high precision ought to be obtained.

With the circuit arrangement of FIG. 1, however, even when a successive approximation type ADC or an integration type ADC commercially available is used as the ADC 14, the DAC system is unsuited to the form of an IC because of the complicated circuit arrangement of the ADC. Another disadvantage is that, since the ADC 14 needs to be operated for all the $2^4$ signals constituting the upper 4 bits of the input signal, the period of time for obtaining the linearity errors becomes long.

SUMMARY OF THE INVENTION

An object of this invention is to solve the problems of the prior art described above and to provide a DAC system which has a simple circuit arrangement suitable for fabrication in the form of an IC and which can obtain a linearity error in a short time.

In order to accomplish the object, this invention provides a DAC system having digital signal input means, means to convert into an analog signal a digital signal including a digital signal from said input means, arithmetic means to evaluate a linearity error of an output signal of the conversion means, and memory means to store values corresponding to the linearity errors, characterized in that said arithmetic means is constructed of a ramp voltage generator, a clock pulse generator, and counting means to count clock pulses from said generator and to evaluate said linearity error on the basis of the count value at each time when an absolute value of a ramp voltage exceeds an absolute value of the output of said conversion means.

DETAILED DESCRIPTION OF THE PREFERRED EMBODIMENTS

Figure 2:
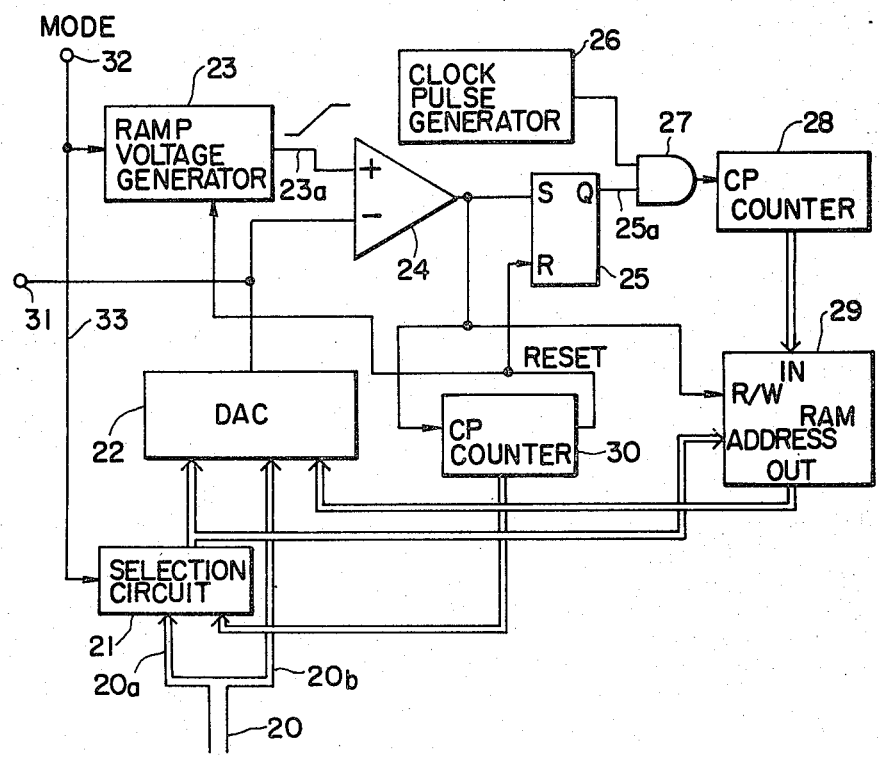
FIG. 2 is a block diagram showing the circuit arrangement of of a first embodiment of a DAC system according to this invention.

FIG. 2 is a circuit arrangement diagram showing the first embodiment of this invention. By way of example, a case is supposed where a digital input signal 20 is made up of an upper bit part 20a including 4 bits and a lower bit part 20b including 6 bits, totaling 10 bits, and where the linearity of the upper 4 bits is inferior while that of the lower 6 bits is superior. It is also assumed that the linearity error of the upper 4 bits is expressed by at most lower 6 bits ($\pm\frac{1}{2}$LSB×32) including the sign bit, with a unit of $\frac{1}{2}$ LSB. Hereunder, the operation of the embodiment in FIG. 2 will be described with reference to a waveform diagram of FIG. 3 by dividing it in accordance with mode signals applied from a terminal 32 into the case of a compensation mode (MODE=1) and the case of a usual digital-to-analog converting operation mode (MODE=0).

(I) Compensation mode (MODE=1)

Figure 3:
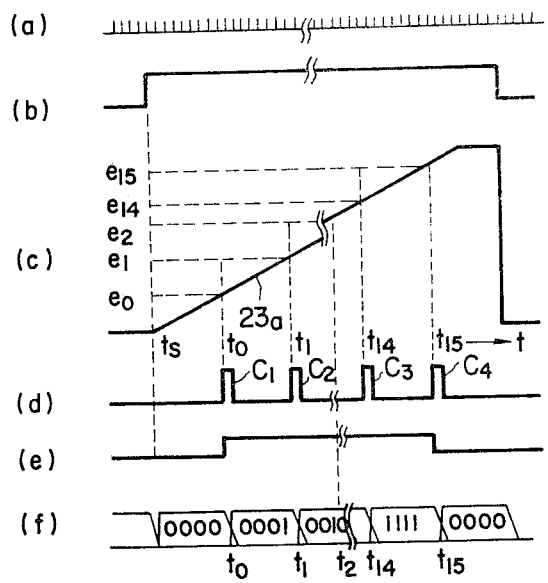
FIG. 3 is a time chart of signal waveforms in principal portions in FIG. 2.

When the mode signal 33 has become logic "1" as shown at (b) in FIG. 3, one of the upper bit part 20a of the digital input signal 20 and an output of a 4-bit binary counter 30 the latter is selected by a selection circuit 21, and it becomes a part of an input signal of a DAC 22. Simultaneously, a ramp voltage generator 23 is started, and a ramp voltage 23a shown at (c) in FIG. 3 begins to rise. As the input signal of the DAC 22, the lower bit part 20b of the digital input signal 20 as consists of 6 bits is applied besides the output of the selection circuit 21. Further, an output of a random access memory (hereinafter, abbreviated to "RAM") 29 for storing the linearity errors of the DAC each being expressed by, for example, 6 bits is applied to a compensation circuit within the DAC 22 to be stated later. At a time $t=t_s$ in FIG. 3, (c) at which the mode signal 33 rises, the counter 30 is cleared. Therefore, when the lower bit part 20b of the digital input signal is set at (000000) in advance, the input signal of the DAC 22 becomes (0000000000). The output of the RAM 29 is also (000000). After all, an output signal of the DAC 22 becomes $e_o$ shown in FIG. 3, (c). Since $e_o$ corresponds to an offset voltage of the DAC 22 and is an error different from the linearity error to which this invention is directed, it is not described in detail. When the ramp voltage 23a has exceeded the voltage $e_o$ at a time $t=t_o$, a pulse $c_1$ shown at (d) in FIG. 3 is provided at the output of a comparator 24, and it sets a set-reset type flip-flop (hereinbelow, abbreviated to "S-R FF") 25 to generate an output signal 25a shown at (e) in FIG. 3. This signal enables an AND gate 27, and clock pulses delivered from a clock pulse generator 26 as shown at (a) in FIG. 3 are applied to a counter 28 so as to start the counting of the number of the clock pulses.

The output pulse $c_1$ of the comparator 24 also becomes a write signal for the RAM 29, so that the content (000000) of the counter 28 at $t=t_o$ is written into the address (0000) of the RAM 29 corresponding to the output signal of the selection circuit 21.

Further, the output pulse $c_1$ of the comparator 24 is applied to the counter 30 to cause it to count up by 1 (one). That is, the content of the counter 30 changes from (0000) till then into (0001) as shown at (f) in FIG. 3.

After $t_o$, the content (0001) of the counter 30 is selected by the selection circuit 21, so that the input signal of the DAC 22 becomes (0001000000) and that the corresponding output becomes $e_1$ shown in FIG. 3, (c). Likewise to the foregoing, when the ramp voltage 23a has exceeded the value $e_1$ at $t=t_1$, a pulse $c_2$ shown in FIG. 3, (d) is provided at the output of the comparator 24. Since the S-R flip-flop 25 has been in the set status, its status remains unchanged. However, the pulse $c_2$ serves as a write signal for the RAM 29, so that the content of the counter 28 at $t=t_1$ is written into the address (0001) of the RAM 29 corresponding to the output signal of the selection circuit 21. The content of the counter 28 at this time is a linearity error for the input signal (0001000000) of the DAC 22.

In the same way, the contents of the counter 28 at $t=t_2-t_{15}$ as shown in FIG. 3, (d) are successively written into the addresses (0010)-(1111) of the RAM 29 in response to the input signals (0010000000)-(1111000000). At the time $t=t_{15}$, the S-R flip-flop 25 is reset by a signal indicating that the content of the counter 30 has reached a predetermined value. Then, a series of processings in the compensation mode have ended.

Here, the counter 28 may have the number of bits corresponding to the maximum compensation quantity and may have 6 bits in the present embodiment. Even in case where the content of the counter 28 has exceeded $2^7$, only the lower 6 bits may be written into the RAM 29 because they are for the compensation. This signifies that the counter 28 also fulfills the function of the arithmetic circuit 15 in FIG. 1.

Let it be supposed by way of example that the oscillation frequency of the clock pulse generator 26 or the slope of the output voltage of the ramp voltage generator 23 is set so that the number of clock pulses to be applied to the counter 28 between the time $t=t_s$ when the input signal of the DAC 22 is (0000000000)=decimal "0" and the time $t=t_{15}$ when it is (1111000000)=decimal "960" may become $2 \times 960 = 1,920$, in other words, that the number of clock pulses per LSB may become 2 (two).

If the linearity error is 0 (zero), the number of clock pulses applied to the counter 28 between the time $t=t_o$ and the time $t=t_1$ when the input signal becomes (0001000000) ought to become $64 \times 2 = 128$. In case where the number of clock pulses has become, for example, 129 or 127, the occurrence of the linearity error of +1 or −1 is indicated, respectively.

Assuming the number of bits of the counter 28 to be 6 (six), the content of the counter 28 returns to the initial state for the count value "128" and is (000000). For the count value "129", the content is (000001) or +1 because $129=128+1$. For the count value "127", the content is (111111) because $127=128-1$, and it is the 2's complement of (−1) with the most significant bit of the 6 bits deemed the sign bit. Accordingly, any linearity error within a range of −32 to +32 at $t=t_o$ to $t_{15}$ can be evaluated by the counter 28 of 6 bits.

Figure 1:
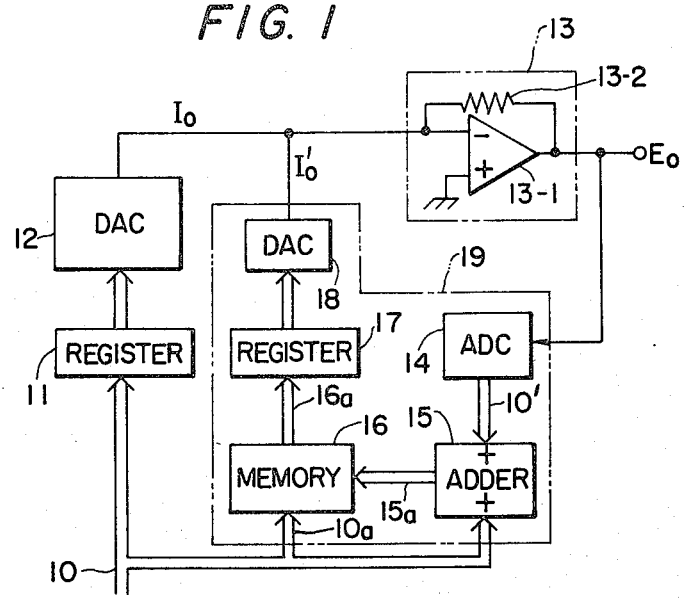
FIG. 1 is a block diagram showing the circuit arrangement of a prior-art DAC system.

Of course, it is also allowed that the counter 28 has its length made 10 bits so as to count all the 1,920 clock pulses applied during $t=t_o-t_{15}$ and that the difference from the input signal of the DAC 22 is calculated by the same adder circuit as in FIG. 1 and then stored into the RAM 29.

(II) Digital-to-analog converting operation mode (MODE=0)

When the mode signal 33 has become logic "0", the upper bit part 20a of the digital input signal 20 is selected by the selection circuit 21 and becomes a part of the input signal of the DAC 22. Simultaneously, it becomes a read address for the RAM 29, and the linearity error stored in the appointed address of the RAM 29 is read out as a compensation quantity and is applied to the compensation circuit portion of the DAC 22 to be described later. In this manner the input signal 20 is applied to the DAC 22 along with the output of the RAM 29 and is converted into an analog signal in the DAC 22, so that the compensated output signal is provided at an output terminal 31.

Figure 4:
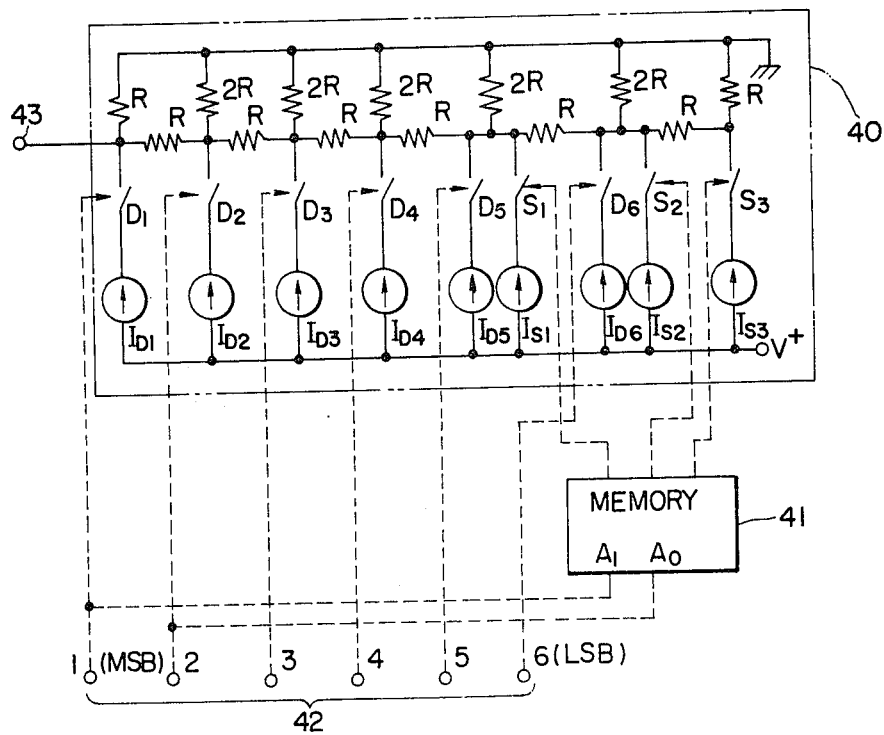
FIG. 4 is a diagram showing the connection relationship between an embodiment of a DAC with a compensation circuit and a memory for storing linearity errors.

FIG. 4 shows an example of the DAC 22 with the compensation circuit and a part of the RAM 29 in FIG. 2. DAC 40 corresponds to the DAC 22, and a memory 41 the RAM 29. For the sake of simplicity, FIG. 4 illustrates a case where the digital input signal is composed of 6 bits and where the linearity error of the upper 2 bits of the 6 bits is compensated for with the lower 3 bits thereof. In this figure, switches $S_1$, $S_2$ and $S_3$ and constant current circuits $I_{s1}$, $I_{s2}$ and $I_{s3}$ correspond to the compensation circuit portion, and the remaining portion is a conventional R-2R ladder network. This R-2R ladder network is constructed of a ladder network of resistors R-2R, switches $D_1$-$D_6$ each of which has its one terminal connected to the corresponding stage of the ladder network and which are turned "on" or "off" by the respective bit signals of the digital input signal 42, and constant current circuits $I_{D1}$-$I_{D6}$ which are connected to the other terminals of the corresponding switches $D_1$-$D_6$.

The linearity errors of the upper 2 bits are stored in the memory 41 constructed of a RAM or the like. When the digital input signal 42 is applied, the upper 2 bits thereof serve also as a read address for the memory 41, and the linearity error already stored is read out from the address appointed by the upper 2 bits. The switches $S_1$-$S_3$ are turned "on" or "off" in accordance with respective bit signals representative of the linearity error, and currents corresponding to a compensation quantity are supplied from the constant current circuits $I_{s1}$-$I_{s3}$. Thus, a desired compensating operation is performed, and a compensated analog signal is provided at an output terminal 43.

It is also allowed that, in lieu of the DAC 22 with the compensation circuit in FIG. 2, a DAC for the input signal and a DAC for converting into an analog signal the linearity error read out from the RAM 29 are arranged in parallel so as to make the compensation of the linearity error by the addition and subtraction of the two DAC outputs. Further, a method is allowed in which the linearity error read out from the RAM 29 is digitally added to the lower 6 bits of the input signal as a compensation quantity.

Figure 5:
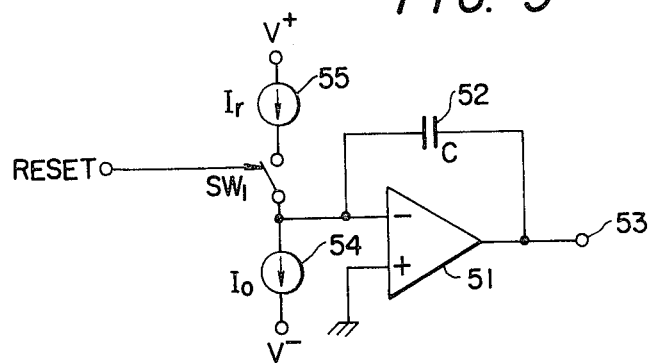
FIG. 5 is a circuit diagram showing an example of a ramp voltage generator in FIG. 2.

FIG. 5 shows an example of the concrete construction of the ramp voltage generator 23 in FIG. 2. Using an operational amplifier 51 and a feedback capacitor 52 (whose capacitance value is C), a current $I_o$ of a constant current circuit 54 is integrated and a ramp voltage having a slope of $I_o/C$ is provided at an output terminal 53. $SW_1$ indicates a switch which is turned "on" by the output signal (RESET) at the time when the count value of the counter 30 in FIG. 2 has reached the predetermined value. In this case, in order to quickly bring the ramp voltage appearing at the output terminal 53 in FIG. 5 into an initial voltage value lower than $e_o$ in FIG. 3, an output current $I_r$ of a constant current circuit 55 biased at a voltage $V^+$ is set at a value sufficiently greater than $I_o$.

Figure 6:
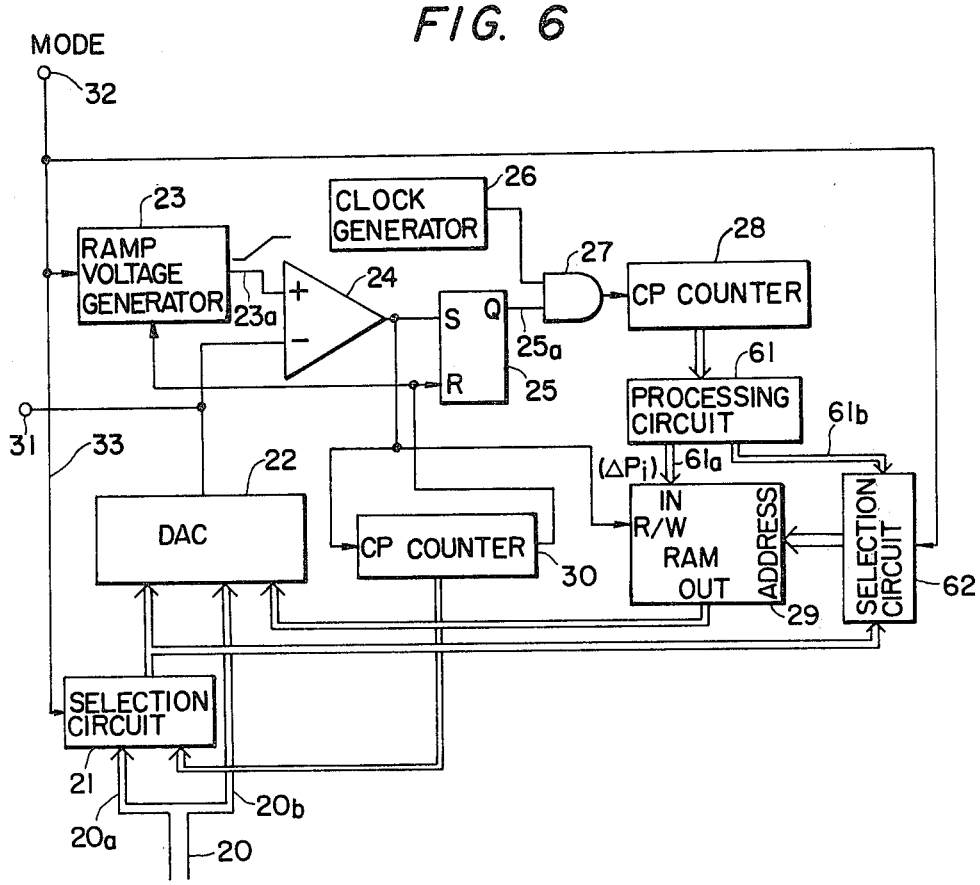
FIG. 6 is a block diagram showing the circuit arrangement of a second embodiment of the DAC system according to this invention.
Figure 10:
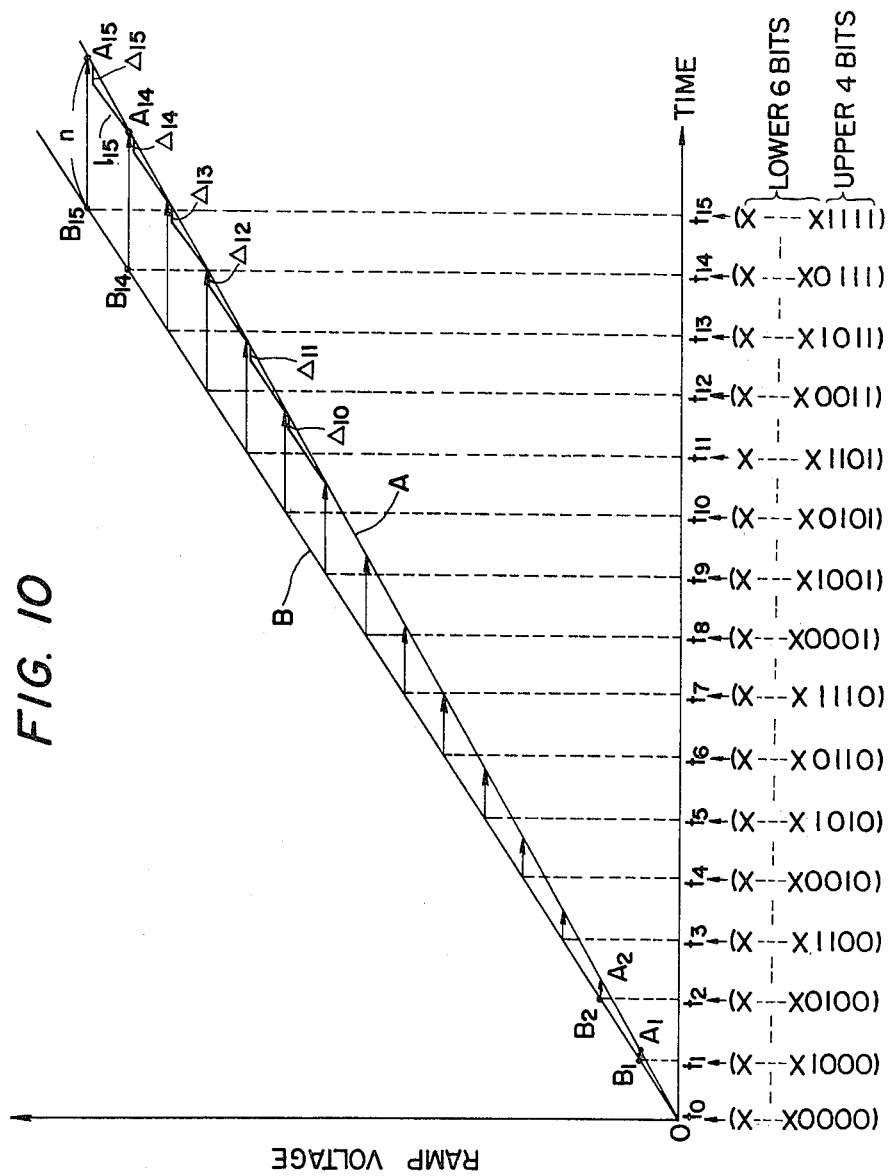
FIG. 10 is a diagram for explaining the compensation of a linearity error on the basis of a change in the slope of the output waveform of the ramp voltage generator.

FIG. 6 is a circuit arrangement diagram showing the second embodiment of the DAC system according to this invention. In the first embodiment shown in FIG. 2, the analog signal appearing at the output terminal 31 has superposed thereon a fluctuation in the slope of the output voltage of the ramp voltage generator 23, a fluctuation in the period of the output pulses of the clock pulse generator 26, an error of the gain of the digital-to-analog conversion in the DAC 22, etc. When all these errors are taken into account in terms of a variation in the slope of the ramp voltage, a slope B shown in FIG. 10 is obtained. A slope A in FIG. 10 indicates the ideal state in which no error exists. In the embodiment of FIG. 2, errors are compensated for so that points $(B_1-B_{15})$ on the slope B at $t=t_1-t_{15}$ may coincide with points $(A_1-A_{15})$ on the slope A respectively. However, in case where the maximum value (n in FIG. 10) of errors which develop during $t=t_1-t_{15}$, in other words, in accordance with the upper 4 bits=(0000)—(1111) in the digital input signal exceeds ±32 clock pulses, the compensation by the embodiment of FIG. 2 is unsatisfactory as stated below. At the time $t=t_i$ ($i=1-15$), the compensation is made so as to render the error 0 (zero). However, in an intervening period expressed by $t_{i-1}<t<t_i$ ($i=1-15$), that is, in an interval after the error has become 0 (zero) at $t=t_{i-1}$ and before $t=t_i$ is reached, an error increases in conformity with the same slope as that B in FIG. 10 in accordance with LOWER 6 bits=(000000)-(111111), and hence, a linearity error above at most $n/16=\pm 2$ clock pulses (1 LSB) develops. By way of example, let's refer to $t=t_{14}-t_{15}$ in FIG. 10. Values $B_{14}$ and $B_{15}$ on the slope B at $t=t_{14}$ and $t=t_{15}$ are compensated for so as to render the errors null and become values $A_{14}$ and $A_{15}$ on the slope A, respectively. In contrast, a value on the slope B at $t_{14}<t<t_{15}$ is compensated for so as to become a value on a straight line $l_{15}$ having the same slope as that B, with the result that a linearity error of $\Delta_{15}$ ($\leq n/16$) develops.

The embodiment of FIG. 6 serves to improve this drawback. A processing circuit 61 made up of a microprocessor or the like and a selection circuit 62 are disposed anew between the counter 28 and the RAM 29 in FIG. 2, and a counter having a sufficiently large number of bits to the extent that no overflow occurs till the time $t_{15}$ is used as the counter 28. Letting the content of the counter 28 at $t=t_i$ ($i=1-15$) be $P_i$ ($i=1-15$), the linearity error $\Delta P_i$ ($i=1-15$) is given by Equation (1):

$$\Delta P_i = P_i - (i/15) \cdot P_{15} \quad (i=1, 2, \ldots, 15) \qquad (1)$$

(where $\Delta P_o = P_o = 0$)

In the compensation mode, the operation of Equation (1) is executed in the processing circuit 61, and an output signal 61a indicative of $\Delta P_i$ thus obtained is written into an appointed address of the RAM 29. The address into which $\Delta P_i$ is written is appointed in such a way that (0001), (0010), ... and (1111) are calculated in the processing circuit 61 for $\Delta P_1$, $\Delta P_2$, ... and $\Delta P_{15}$ respectively and that an output signal 61b indicative of the execution of the calculation is selected by the selection circuit 62. That is, the embodiment of FIG. 6 intends to compensate for the linearity error developing in the DAC 22, on the slope B with reference to the value $P_o=0$ and value $P_{15}$ on the slope B in FIG. 10. Marks X in LOWER 6 BITS in FIG. 10 denote "0" or "1".

In the digital-to-analog converting operation mode, the upper bit part 20a of the digital input signal 20 is selected in the selection circuit 62 and serves as a read address for the RAM 29. The linearity error $\Delta P_i$ is read out from the appointed address, and it is applied to the compensation circuit portion of the DAC 22 as a compensating quantity.

Using the circuit arrangement shown in FIG. 6, it is also possible to avoid errors ascribable to the amplitude value of noise in the output of the DAC 22.

Figure 7:
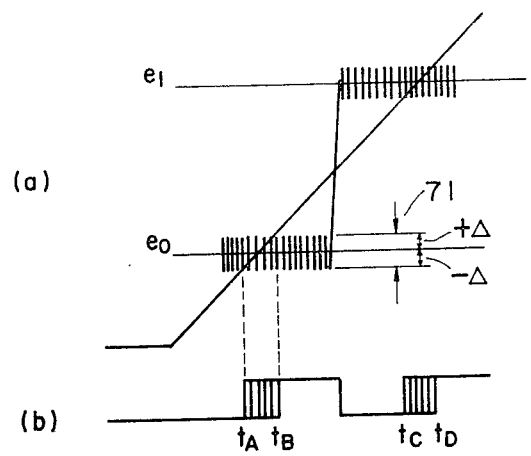
FIG. 7 is a time chart of an offset error signal which appears in a DAC output.

For example, an offset error 71 as shown at (a) in FIG. 7 exists in the output voltage $e_o, e_1, \ldots$ of the DAC 22 to become a reference input to the comparator 24 in FIG. 6. The error attributed thereto may be compensated for in such a way that, in the compensation mode, $(P_A+P_B)/2$, $(P_C+P_D)/2, \ldots$ are calculated as the approximate values of errors for the output voltages $e_o, e_1, \ldots$ in the processing circuit 61 of FIG. 6 from the contents $P_A, P_B, P_C, P_D, \ldots$ of the counter 28 at $t=t_A, t_B, t_C, t_D, \ldots$ as shown at (b) in FIG. 7, the calculated results being written into the RAM 29, while in the digital-to-analog converting operation mode, the values $(P_A+P_B)/2$, $(P_C+P_D)/2, \ldots$ are read out from the memory 29 and are applied to the compensation circuit portion of the DAC 22 as compensation quantities. Further, a compensation quantity for the error 71 may well be evaluated in such a way that the error 71 illustrated in FIG. 7, (a) is divided into a plus component $(+\Delta)$ and a minus component $(-\Delta)$, that compensation quantities for the respective components $+\Delta$ and $-\Delta$ are found by employing for $+\Delta$ a ramp voltage generator producing a positive voltage and employing for $-\Delta$ a ramp voltage generator producing a negative voltage, and that the compensation quantities are added.

Figure 8:
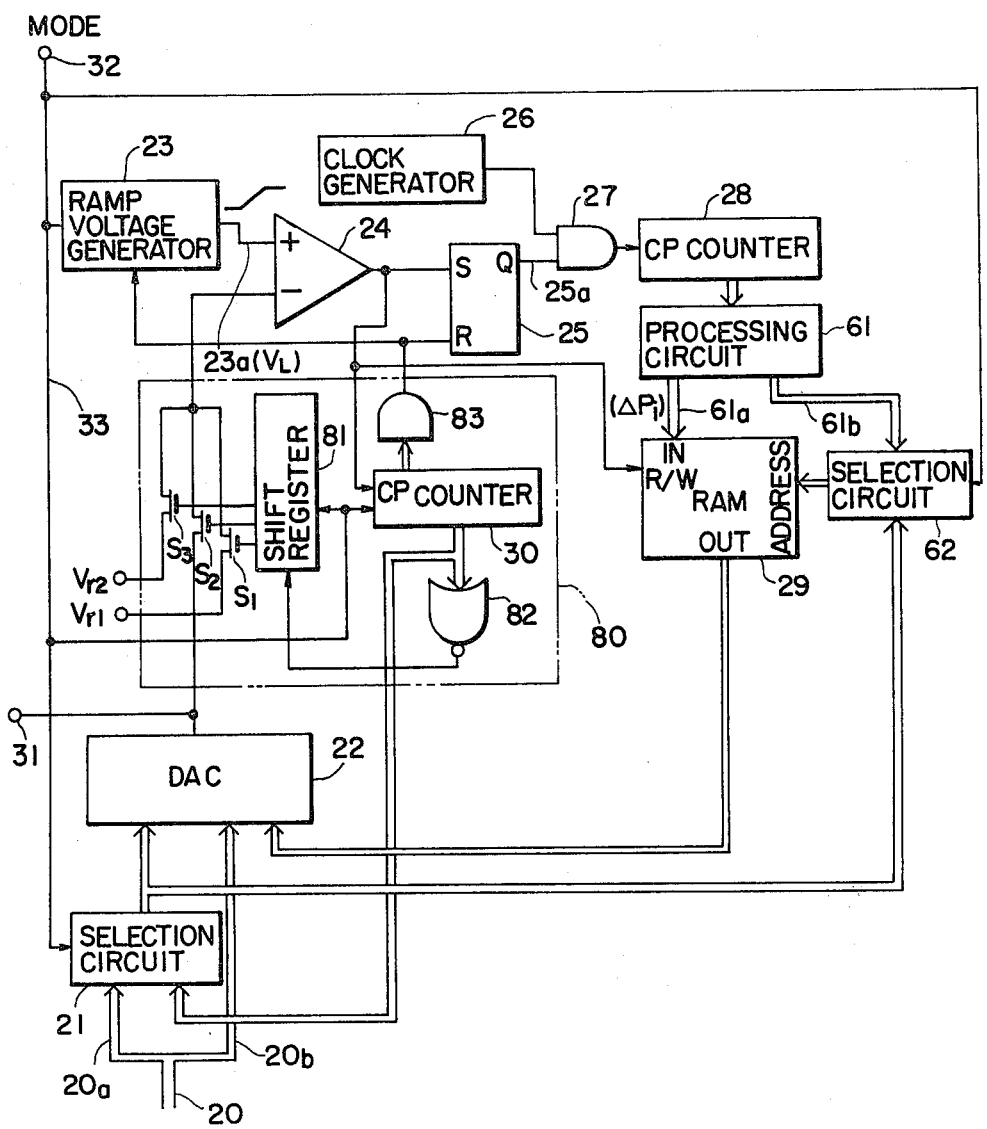
FIG. 8 is a block diagram showing the circuit arrangement of a third embodiment of the DAC system according to this invention.

FIG. 8 shows the third embodiment of the DAC system according to this invention, and the present embodiment achieves an enhancement in the absolute precision of the DAC output. Referring to FIG. 8, $V_{r1}$ and $V_{r2}$ designate reference voltages for a DAC output 31 respectively. Any one of the voltages $V_{r1}$ and $V_{r2}$ and the output signal of the DAC 22 is selected by switches $S_1-S_3$ adapted to turn "on" or "off" by a shift register 81 within a controller 80, and becomes one input signal of the comparator 24.

The controller 80 includes the counter 30, and is constructed of the shift register 81, the switches $S_1-S_3$ which are controlled by outputs from the shift register 81, a NOR gate 82 which receives the contents of the respective bits of the counter 30, and an AND gate 83 which receives the contents of specified 2 bits of the counter 30.

The construction of the remaining portion is quite the same as the construction shown in FIG. 6.

Figure 9:
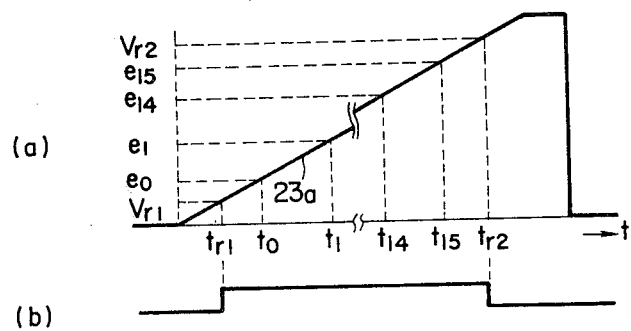
FIG. 9 is a diagram showing the time relationship in FIG. 8 among reference voltages $V_{r1}$ and $V_{r2}$, a DAC output voltage and an output waveform of a ramp voltage generator.

Referring now to FIGS. 8 and 9, there will be explained a process in which, in the compensating mode, a linearity error of the DAC 22 with an offset error and an error of a full-scale voltage output (gain error) taken into account is evaluated and stored into the RAM 29.

When the mode signal 33 has become logic "1", the ramp voltage generator 23 is started, and the output voltage 23a ($V_L$) begins to rise. Simultaneously, using the mode signal 33 as a preset signal, (1111) is preset in the counter 30. At this time, supposing by way of example that "1" is stored at the first bit of the shift register 81 as viewed from the input side thereof, the switch $S_1$ is turned "on" by the output of the first bit, and the reference voltage $V_{r1}$ becomes one input of the comparator 24.

The output $V_L$ of the ramp voltage generator 23 is compared with the voltage $V_{r1}$ in the comparator 24. When $V_L=V_{r1}$ has been established at a time $t=t_{r1}$ as shown at (a) in FIG. 9, the comparator 24 provides an output pulse which sets the S-R FF 25 to generate an output signal 25a shown at (b) in FIG. 9 and which causes the counter 30 to count up by 1 (one). The output signal 25a enables the AND gate 27, so that clock pulses provided from the clock pulse generator 26 are applied to the counter 28 and that the counting of the applied clock pulses is initiated. Since the content of the counter 30 is (0000) at this time, the output of the NOR gate 82 becomes "1". Accordingly, the content of the shift register 81 shifts by 1 (one) bit, and the switch $S_2$ is turned "on" so as to select the output of the DAC 22. Thereafter, in quite the same way as in the case of the compensating mode in FIG. 2, the contents $P_o, P_1, \ldots$ and $P_{15}$ of the counter 28 at times $t=t_o, t_1, \ldots$ and $t_{15}$ at which the output $V_L$ becomes equal to the output voltages $e_o, e_1, \ldots$ and $e_{15}$ of the DAC 22 respectively are provided. Subsequently, when the content of the counter 30 becomes (0000) again to render the output of the NOR gate 82 "1", the content of the shift register 81 shifts by 1 (one) bit, the switch $S_3$ is turned "on" to select the reference voltage $V_{r2}$, and this reference voltage is compared with the output $V_L$ in the comparator 24. At a time $t=t_{r2}$ at which $V_L=V_{r2}$ is held, the content $P_{r2}$ of the counter 28 is delivered, and simultaneously, the content of the counter 30 becomes (0001). When, by way of example, the AND gate 83 is enabled in case where the content of the counter 30 becomes (0001) and where the shift register 81 selects the switch $S_3$, the S-R FF 25 and the ramp voltage generator 23 are reset by an output from the AND gate 83.

The values $P_o, P_1, \ldots P_{15}, P_{r2}$ and $V_{r1}, V_{r2}$ are stored in a memory portion of the processing circuit 61. It is supposed that ideal outputs $V_o, V_1, \ldots$ and $V_{15}$ for the respective outputs $e_o, e_1, \ldots$ and $e_{15}$ of the DAC 22 are also stored in the memory portion. At this time, linearity errors $\Delta P_o, \Delta P_1, \ldots$ and $\Delta P_{15}$ for the outputs $e_o, e_1, \ldots$ and $e_{15}$ of the DAC 22 are calculated in the processing circuit 61 in accordance with Equation (2):

$$\oplus P_i = P_i - (V_i - V_{1r}/V_{2r} - V_{1r}) \cdot P_{r2} \quad (i=0, 1, \ldots, 15) \qquad (2)$$

The values $\Delta P_i$ obtained with Equation (2) are written into predetermined addresses of the RAM 29 {$\Delta P_o$, $\Delta P_1, \ldots$ and $\Delta P_{15}$ are respectively written into addresses (0000), (0001), ... and (1111) selected in the selection circuit 61}.

As set forth above, according to this invention, the fabrication of the DAC in the form of an IC is facilitated owing to the use of the ramp voltage generator which has the simple circuit arrangement and which exhibits the output characteristics of excellent linearity. Another advantage is that, since the linearity errors can be evaluated for all the combinations of the group of bits to be compensated for, within one operating period of the ramp voltage generator, the period of time for obtaining the total compensation quantity is sharply shortened. Further, the compensation of the absolute precision is permitted merely by additionally providing two reference voltage sources.

We claim:

1. A digital-to-analog converter system comprising selection means responsive to a selection signal to apply to an output thereof either a digital signal to-be-converted or a digital input signal, conversion means to convert into an analog signal the digital signal at the output of said selection means, arithmetic means connected to receive said analog signal for generating signal quantities corresponding to an error in the analog signal produced by said conversion means, memory means to store said signal quantities corresponding to such errors at locations designated by the digital output of said selection means, and means for reading out said signal quantities from said memory means and for applying the read out signal quantities to said conversion means when the selection signal effects application of the digital signal to-be-converted to said conversion means; said arithmetic means including first generation means for generating a ramp voltage, second generation means for generating a clock pulse signal, first counting means for counting said clock pulse signal, comparison means for comparing the ramp voltage to the analog output of said conversion means and for generating an output pulse each time the absolute value of the ramp voltage becomes greater than the absolute value of said analog signal of said conversion means and second counting means driven by said output pulses for producing said digital input signal.

2. A digital-to-analog converter system with a compensation circuit as defined in claim 1, wherein said second counting means comprises a counter whose content changes by one each time the absolute value of said ramp voltage becomes greater than the absolute value of said output signal of said conversion means, said selection means operating to select either the content of said counter or a specified part of said digital signal to-be-converted, and means to apply the output of the selection means, the part of said digital signal to-be-converted other than the specified part and the output of said memory means to said conversion means.

3. A digital-to-analog converter system with a compensation circuit as defined in claim 1, wherein said comparison means includes control means to select either the output voltage of said conversion means or at least one reference voltage in accordance with the content of said first counter and for supplying the selected voltage to said comparison means as the voltage to be compared with said ramp voltage.

4. A digital-to-analog converter system with a compensation circuit comprises:
input means for supplying either a digital input signal or a first digital signal to an output thereof for detection as digital data to be converted;
conversion means for converting the digital output from said input means and a second digital signal for compensation to an analog voltage;
first generating means for generating a ramp voltage;
comparison means for comparing the ramp voltage from said first generating means with the analog voltage from said conversion means and for generating an output pulse each time the absolute value of the ramp voltage exceeds the absolute value of the analog voltage;
second generating means for generating clock pulses;
counting means to count the number of the clock pulses from said second generating means in response to the output pulse from said comparison means;
first controlling means for changing the value of said first digital signal each time said comparison means generates an output pulse;
memory means;
second controlling means for storing the contents of said counting means, in response to the output pulse from said comparison means, into said memory means at an address which is indicated by said first digital signal; and
third controlling means for reading out a signal from said memory means at an address which is indicated by said digital input signal and for supplying this read out signal to said conversion means as said second digital signal.

5. A digital-to-analog converter system with a compensation circuit as defined in claim 4, wherein said first controlling means comprises a counter whose content changes by one each time said output pulse is generated, and said input means comprises selection means for selecting either said first digital signal or a specified part of said digital input signal in response to an applied selection signal, and means to apply the output of the selection means, the other part of said digital input signal than said specified part and the output of said memory means to said conversion means.

6. A digital-to-analog converter system with a compensation circuit as defined in claim 4 or 5, wherein said comparison means includes fourth controlling means for selecting either the output voltage of said conversion means or at least one reference voltage in accordance with said first digital signal and for supplying the selected voltage to said comparison means as the voltage to be compared with said ramp voltage.

7. A digital-to-analog converter system with a compensation circuit as defined in claim 4, 5 or 6, which further includes digital processing means for calculating a third digital signal corresponding to the contents of said counting means and for calculating the write-address on said memory means into which said third digital signal is stored, and means to select either said write-address or the read-address on said memory means given by said digital input signal, from which said second digital signal is read out.

* * * * *